United States Patent
Niitsuma

Patent Number: 5,189,330
Date of Patent: Feb. 23, 1993

[54] SURFACE ACOUSTIC WAVE DEVICE

[75] Inventor: Teruo Niitsuma, Tokyo, Japan

[73] Assignee: Clarion Co., Ltd., Tokyo, Japan

[21] Appl. No.: 764,053

[22] Filed: Sep. 23, 1991

Related U.S. Application Data

[63] Continuation of Ser. No. 567,952, Aug. 15, 1990, abandoned.

[30] Foreign Application Priority Data

Aug. 16, 1989 [JP] Japan ................... 1-211999
Aug. 16, 1989 [JP] Japan ................... 1-212000

[51] Int. Cl.$^5$ ........................... H01L 41/08
[52] U.S. Cl. ..................... 310/313 B; 310/313 D; 364/821; 333/152; 333/153; 333/154; 333/195
[58] Field of Search ............... 333/152, 153, 154, 195; 364/821; 310/313 B, 313 D

[56] References Cited

U.S. PATENT DOCUMENTS

| | | | |
|---|---|---|---|
| 3,770,949 | 11/1973 | Whitehouse et al. | 364/821 |
| 3,845,420 | 10/1974 | Holland et al. | 310/313 B |
| 4,372,163 | 2/1983 | Tittmann et al. | 364/550 |
| 4,633,117 | 12/1986 | Bloch et al. | 310/313 D |
| 4,707,631 | 11/1987 | Stokes et al. | 333/195 |
| 4,748,364 | 5/1988 | Mitsutsuka | 310/313 D |
| 4,809,213 | 2/1989 | Grassl | 364/821 |
| 4,841,470 | 6/1989 | Okamoto et al. | 364/821 |
| 4,894,576 | 1/1990 | Okamoto et al. | 310/313 D |
| 4,950,935 | 8/1990 | Furukawa | 333/154 |
| 4,965,480 | 10/1990 | Mochizuki | 310/313 D |
| 5,003,213 | 3/1991 | Mochuzuki et al. | 310/313 D |

FOREIGN PATENT DOCUMENTS

| | | | |
|---|---|---|---|
| 0153092 | 8/1985 | European Pat. Off. | 333/195 |
| 0073917 | 6/1981 | Japan | 333/195 |
| 0199317 | 9/1986 | Japan | 333/195 |
| 0144610 | 6/1988 | Japan | 333/152 |
| 0726646 | 4/1980 | U.S.S.R. | 310/313 D |
| 0959102 | 9/1982 | U.S.S.R. | 364/821 |
| 2069279 | 8/1981 | United Kingdom | 333/153 |

OTHER PUBLICATIONS

"Broadband, Amplitude & Phase-Compensating Transducers for Monolithic Convolvers" by M. Smith of Hughes Aircraft Company Conference: 1980 Ultrasonics Symposium Proceedings Boston, Mass. USA, Nov. 5-7, 1980.

Primary Examiner—Mark O. Budd
Assistant Examiner—Thomas M. Dougherty
Attorney, Agent, or Firm—Flynn, Thiel, Boutell & Tanis

[57] ABSTRACT

An SAW convolver is disclosed, in which a pair of input transducer means disposed at the left and right end portions on a piezoelectric substrate having a velocity dispersion consists of a plurality of pairs of input transducers and the distance between different pairs of input transducers differs from each other so as to compensate the velocity dispersion.

17 Claims, 5 Drawing Sheets

SURFACE ACOUSTIC WAVE DEVICE

This application is a continuation of U.S. Ser. No. 07/567,952, filed Aug. 15, 1990, now abandoned.

FIELD OF THE INVENTION

The present invention relates to a surface acoustic wave (hereinbelow abbreviated to SAW) device and in particular to an improvement of an SAW convolver used in a spread spectrum (hereinbelow abbreviated to SS) communication system.

BACKGROUND OF THE INVENTION

At present, wide application of the SAW element is studied and research and development thereof are performed. Attention is paid in particular to an SAW convolver having a real time convolution function e.g. as an important device in a demodulator in the SS communication system, which is expected as a next generation communication system for civil use. In this SS communication system, since the carrier is spread into a wide frequency band by using a pseudo noise (hereinbelow abbreviated to PN) code, it is required for the SAW convolver to have wide band frequency characteristics.

The basic structure of the SAW convolver stated above consists of two interdigital electrodes 2 and 2' formed on a piezoelectric substrate 1 and an output gate electrode 3 formed therebetween as indicated in FIG. 7. The convolution operation is effected by transforming two input signals f(t) and g(t) into SAWs by means of the input interdigital electrodes 2 and 2', respectively, which SAWs propagate in an interaction region under the output gate electrode in directions opposite to each other to be multiplied by each other by using an elastic non-linearity or the non-linear property of semiconductor and integrated by the gate electrode.

The SAW convolver described above is classified into 3 sorts, depending on the structure thereof, i.e. they are known as an elastic convolver utilizing an elastic non-linear property, an air gap type convolver utilizing the non-linear property of semiconductor, in which a piezoelectric body and a semiconductor are brought close through an extremely small gap, and a monolithic type convolver, in which a piezoelectric thin film is superposed on a semiconductor substrate to form a monolithic body. It is thought that the most advantageous structure among them is the monolithic type utilizing the non-linear property of semiconductor, with which a high-efficiency can be obtained and no extremely small gap is required.

However, since the piezoelectric substrate of multi-layered structure constituted by a plurality of materials, in which the sound velocity differs, has a velocity dispersion, by which the sound velocity of the SAW differs, depending on the frequency, the monolithic type convolver described above has a problem that the working frequency band is restricted and that it is difficult to widen the frequency band. Further the design taking the compensation of this velocity dispersion into account is extremely complicated.

Further in an SAW convolver having a prior art structure, since the output gate electrode effecting the convolution operation is either a single rectangular electrode or a plurality of strip-shaped electrodes, which are parallel to the propagation direction of the SAW and have a same length, the effective integration time differs, depending on the frequency in a wide frequency band, which is a cause of worsening spurious characteristics.

Contrarily thereto, another structure is proposed, in which chirp type electrodes 4 and 4', where the pitch of the fingers constituting the interdigital electrodes is varied continuously along the propagation direction of the SAW so that the position where the SAW is excited is varied, corresponding to the frequency, as indicated in FIG. 8, are used for the input transducers in order to compensate the velocity dispersion. However, since all the components in the frequency band use essentially a same propagation path in common, the phenomenon that the integration time differs, depending on the frequency, cannot be avoided.

OBJECT OF THE INVENTION

The present invention has been done in order to solve the problems described above and an object thereof is to provide an SAW device capable of performing an ideal convolution operation with an SAW convolver using a piezoelectric substrate having a velocity dispersion.

Another object of the present invention is to provide an SAW convolver using wide band transducers, which can be designed in a simple manner, removing the complexity in the design by the prior art method described previously.

SUMMARY OF THE INVENTION

In order to achieve the above objects, an SAW device according to a first of the present inventions comprises a piezoelectric substrate, in which the sound velocity of the SAW has a velocity dispersion; a pair of input transducer means at the left and right end portions on the substrate; and an output gate electrode formed on the substrate between the input transducer means; wherein the input transducer means consist of a plurality of pairs of input transducers juxtaposed in the direction perpendicular to the propagation direction of the SAW; each of the pairs of input transducers is composed of uniform pitch interdigital electrodes; the pitches of the electrodes of different pairs are different; the pairs of input transducers are connected in parallel and the distance between different pairs of input transducers differs from each other.

An SAW device according to a second of the present inventions comprises a piezoelectric substrate, in which the sound velocity of the SAW has a velocity dispersion represented by a function of the frequency; a pair of input transducers at the left and right end portions on the substrate; and an output gate electrode formed on the substrate between the input transducers; wherein the distance between the pair of input transducers varies in the direction perpendicular to the propagation direction of the SAW; and the length of the output gate electrode in the propagation direction of the SAW varies also in the direction perpendicular thereto.

Further an SAW device according to a third of the present inventions comprises a piezoelectric substrate, in which the sound velocity of the SAW has a velocity dispersion represented by a function of the frequency; a pair of input transducer means at the left and right end portions on the substrate; and an output gate electrode formed on the substrate between the input transducer means; wherein the input transducer means consist of a plurality of pairs of juxtaposed input transducers; and the length of the output gate electrode in the propagation direction of the SAW varies in the direction perpendicular thereto.

In the SAW device thus constructed, since the length of the output gate electrode in the propagation direction of the SAW varies in the direction perpendicular to the propagation direction of the SAW, the effective integration time can be kept almost constant over the whole working frequency band.

Further, in the SAW device thus constructed, since the input transducers compensate the velocity dispersion in the piezoelectric substrate and at the same time each of the interdigital electrodes constituting them has an extremely simple construction having a uniform pitch, the design thereof is easy.

DETAILED DESCRIPTION

Figure 1A:
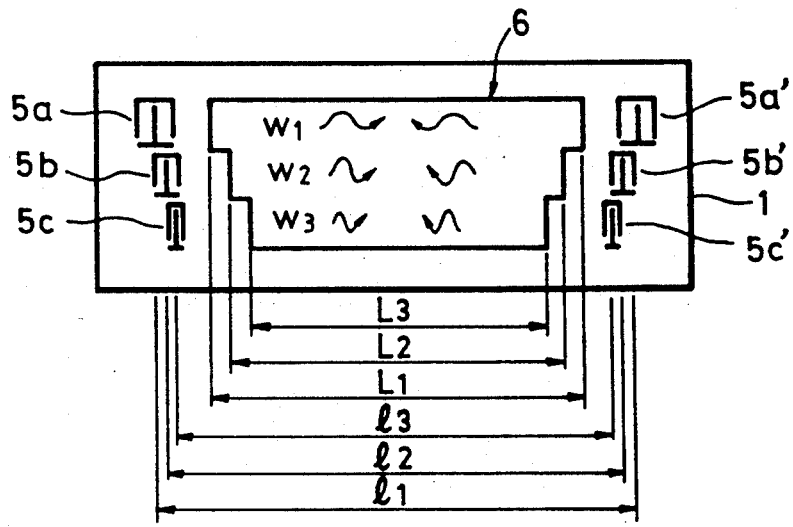
FIG. 1A is a plan view of an SAW convolver indicating an embodiment of the present invention.

Hereinbelow the present invention will be explained concretely, referring to the drawings indicating various sorts of embodiments.

FIG. 1A shows an embodiment of the present invention, in which an piezoelectric substrate 1 has a layered structure of e.g. piezoelectric layer/insulating layer/semiconductor having a velocity dispersion.

Figure 1B:
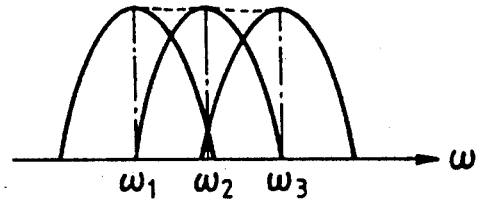
FIG. 1B shows frequency characteristics of an interdigital electrode.

In the present embodiment, as indicated in FIGS. 1A and 1B, the whole working frequency band is divided into a plurality of frequency regions and the propagation path of the SAW including different frequency components is separated into channels by disposing a plurality of pairs of input transducers, each of which consists of a pair of input interdigital electrodes $5a \cdot 5a'$, $5b \cdot 5b'$, and $5c \cdot 5c'$ on the left and right sides, whose central frequency is the center $\omega_1$, $\omega_2$ and $\omega_3$ each of the frequency regions, with distances $l_1$, $l_2$ and $l_3$, respectively, i.e. the so-called filter bank type structure is used. Further the output gate electrode 6 has different lengths $L_1$, $L_2$ and $L_3$ in the propagation direction of the SAW for the different channels.

Here, if the sound velocity of the SAW is represented by a function $v(\omega)$ of the frequency $\omega$, the distances $l_1$, $l_2$ and $l_3$ between the input interdigital electrodes $5a$ and $5b$ and $5c$ and $5c'$ having same central frequencies, are determined so as to be given by:

$$\frac{l_1}{v(\omega_1)} = \frac{l_2}{v(\omega_2)} = \frac{l_3}{v(\omega_3)} = \tau$$

where $\tau$ represents the desired delay time. In this way, it is possible to compensate the delay time characteristics due to the velocity dispersion. Further, at the same time, the lengths $L_1$, $L_2$ and $L_3$ of the output gate electrodes for the different channels are determined so as to be given by:

$$\frac{L_1}{v(\omega_1)} = \frac{L_2}{v(\omega_2)} = \frac{L_3}{v(\omega_3)} = T$$

where T represents the desired integration time. In this way, it is possible to keep the effective integration time almost constant over the whole working frequency band.

In the present embodiment, although the number of channels is small, in order to facilitate the explanation, the effect of the compensation of the velocity dispersion and the uniformity of the effective integration time within the frequency band can be increased with the increasing number of division.

Figure 1C:
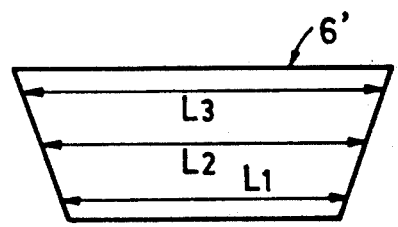
FIGS. 1C to 1E are plan views showing examples of modification of the output gate electrode.

In the embodiment described above, each of the end portions of the output gate electrode 6 is varied stepwise. However an effect equivalent to that described above can be obtained, if the distance between the two extremities fulfills the condition described above at least at the center of each of the channels, even if the end portions of the gate electrode 6' varies continuously, as indicated in FIG. 1C.

Figure 1D:
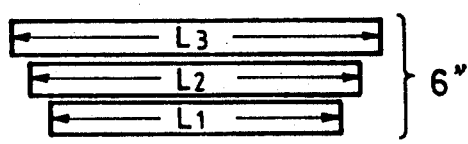
Figure 1E:
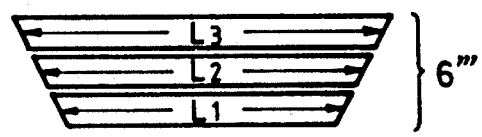

Further, as indicated in FIGS. 1D and 1E, if the output gate electrode is separated for every channel to form electrodes 6" and 6"' of structure consisting of a plurality of strip lines, it is possible to obtain an effect of suppressing crosstalk between channels by the waveguide effect.

Figure 2A:
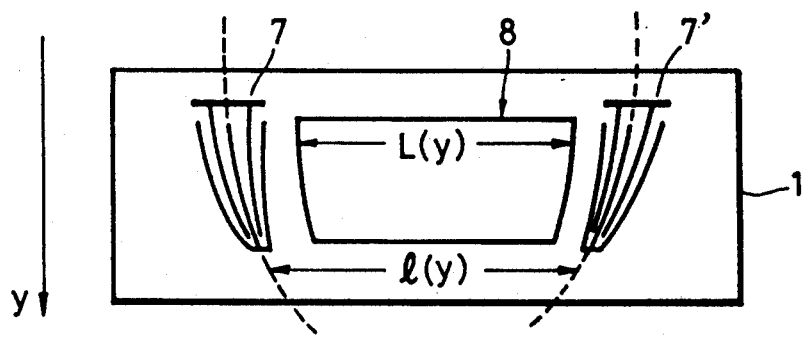
FIG. 2A is a plan view of an SAW convolver indicating another embodiment.

FIG. 2A shows an embodiment, in which so-called inclined electrode fingers 7 and 7' are used as the pair of input transducers on the left and right sides, the pitch between adjacent two electrode fingers of which varies continuously in the direction perpendicular to the propagation direction of the SAW.

In this case, the frequency of the SAW excited by the electrode fingers is distributed continuously in the y-direction in the figure and can be represented by $\omega(y)$ Here, it is possible to compensate the velocity dispersion by inclining the center lines of the electrode fingers so that the distance $l(y)$ measured parallelly to the propagation direction of the SAW between the center lines of the electrodes 7 and 7' can be represented by:

$$\frac{l(y)}{v(\omega(y))} = \tau$$

where $\tau$ represents the desired delay time, and at the same time it is possible also to make the integration time uniform within the frequency band, similarly to the first embodiment described above, by varying the end portions of the output gate electrode 8 in the propagation direction of the SAW so that $$\frac{L(y)}{v(\omega(y))} = T$$

where T represents the desired integration time, is satisfied.

Figure 2B:
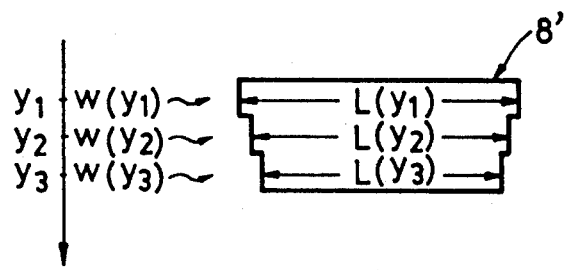
FIG. 2B is a plan view showing an example of modification of the output gate electrode.

Also in the present embodiment, as indicated in FIG. 2B, it is possible to use an output gate electrode 8', whose end portions vary discontinuously along the y-direction. In this case, the regions, in each of which $L(y)$ is constant, are parallel to the propagation direction of the SAW and $L(y)$ should satisfy $$\frac{L(y)}{V(\omega(y))} = T$$

for the frequency $\omega(y)$ of the SAW at the center y of each of the regions.

Further, as described in the first embodiment, it is also useful to separate the output gate electrode into a plurality of regions parallel to the propagation direction of the SAW and to utilize the effect of suppressing the crosstalk between different regions due to the waveguide effect.

Figure 3A:
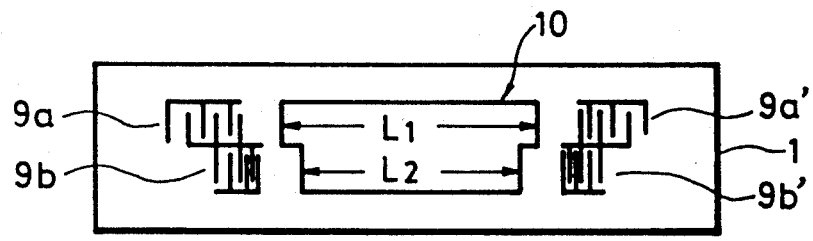
FIG. 3A is a plan view of an SAW convolver indicating still another embodiment.
Figure 3B:
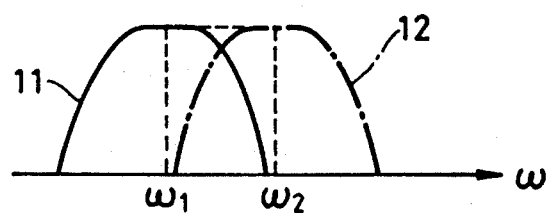
FIG. 3B shows frequency characteristics of an interdigital electrode.

FIG. 3A shows an embodiment, in which chirp type electrodes 9a·9a' and 9b·9b' aiming the effect of compensating the velocity dispersion and widening the frequency band are used for the input transducers and two series of input electrodes are parallelly disposed with frequency bands displaced from each other, as indicated in FIG. 3B. Reference numerals 11 and 12 are curves indicating frequency characteristics of the input electrodes 9a·9a' and 9b·9b' respectively. In this case, the lengths L and Lz of the output gate eletrode 10 in the propagation direction of the SAW are so determined that $$\frac{L_1}{v(\omega_1)} = \frac{L_2}{v(\omega_2)} = T$$

is satisfied for the frequencies $\omega_1$ and $\omega_2$ at the centers of the SAWs propagating in the two channels, respectively.

Further, similarly to the first embodiment described above, the various shapes indicated in FIGS. 1C, 1D and 1E are possible and the number of divided channels may be greater than 2.

Figure 4:
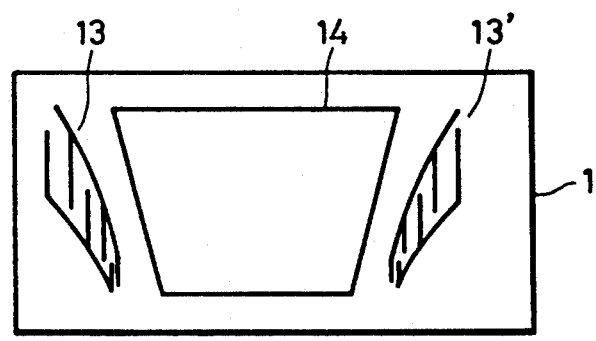
FIG. 4 is a plan view of an SAW convolver, indicating still another embodiment.

FIG. 4 shows an embodiment, in which inclined chirp type electrodes 13 and 13' are used and description similar to that disclosed in the embodiments, referring to FIGS. 2A and 2B, is applied to the output gate electrode 14.

Figure 5:
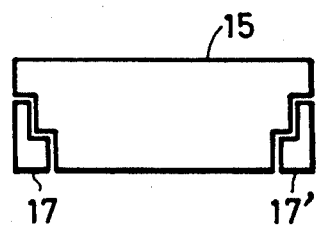
FIGS. 5 and 6 are plan views of different output gate electrodes, with which dummy electrodes are combined.
Figure 6:
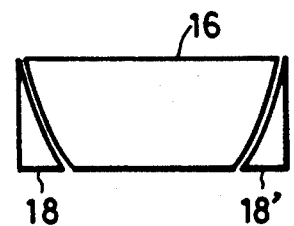
Figure 7:
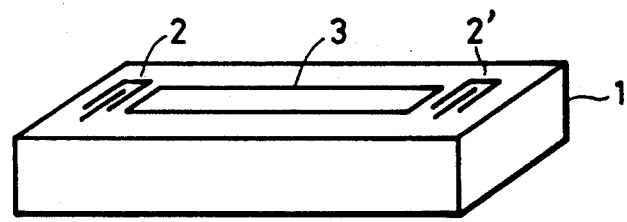
FIG. 7 is a perspective view of a prior art fundamental SAW convolver.
Figure 8:
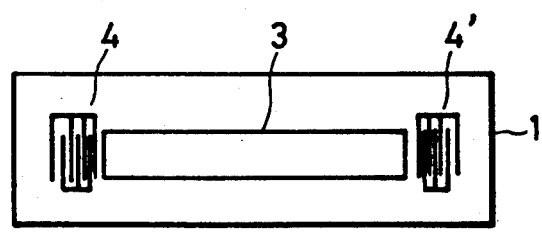
FIG. 8 is a plan view of an SAW convolver using chirp type electrodes.

In all the embodiments described above, since the end portions of the output gate electrode, to which the SAWs are injected, are defined by straight lines in the direction perpendicular to the propagation direction of the SAWs in none of the cases, it is possible that the wave front of the SAWs is distorted. Therefore, e.g. as indicated in FIGS. 5 and 6, it is possible to prevent the distortion of the wave front described previously by using a structure, in which dummy gates 17, 17' and 18, 18', which are not in contact with the output gate electrodes 15 and 16, respectively, are disposed between the gate electrodes and the input electrodes so that the end portions of the output gates are straight in the y-direction and that the lengths of the metallic parts on the propagation paths of the SAWs are equal for all the channels.

Figure 9:
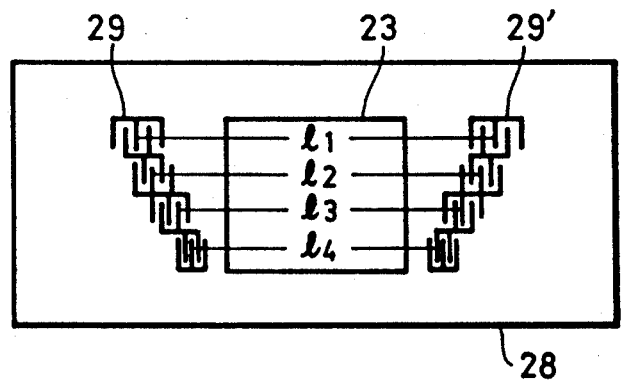
FIG. 9 is a plan view of an SAW convolver indicating still another embodiment of the present invention.

FIG. 9 is a plan view of an SAW convolver indicating still another embodiment, in which reference numeral 28 is a piezoelectric substrate, 29 and 29' are input transducer means consisting of a plurality of pairs of input transducers on the left and right sides, and 23 is an output gate electrode. Here the input transducers 29 and 29' are of so-called filter bank type structure, in which a plurality of groups of uniform pitch interdigital electrodes, different groups having different pitches, are connected in parallel, in order to separate propagation paths of the SAWs excited by input signals including frequency components of wide frequency band into a plurality of groups in the direction perpendicular to the propagation direction of the SAWs, depending on the frequency and the distances $l_1, l_2, l_3, l_4 \ldots l_n$ between the electrodes having same pitches of different pairs of input transducers in the input transducer means 29 and 29' are so designed that $l_n/v(\omega_n)$ has an almost constant value for all the channels formed by the division, when the angular frequency of the SAW corresponding to the respective pitch is represented by $\omega_n$.

For example, in the case where the desired delay time for the central angular frequency $\omega_0$ of the SAW element is represented by $\tau$, the propagation distance $l_n$ in each of the channels is given by $l_n = \tau \cdot v(\omega_n)$.

Figure 10:
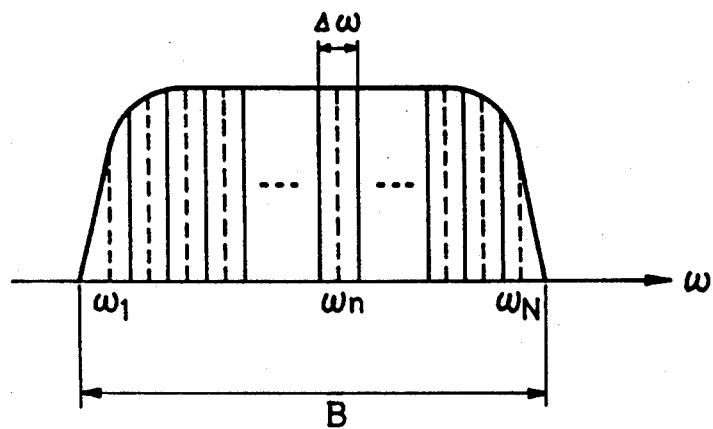
FIG. 10 is a scheme for explaining how to define the pitch of the interdigital electrodes.

The pitch of each of the uniform pitch interdigital electrodes constituting the input transducer means is so determined that the central angular frequency $\omega_n$ thereof is the central angular frequency of each of the band width $\Delta\omega_n$ obtained by dividing the working frequency band (B) of the SAW element by N, as indicated in FIG. 10.

Figure 11:
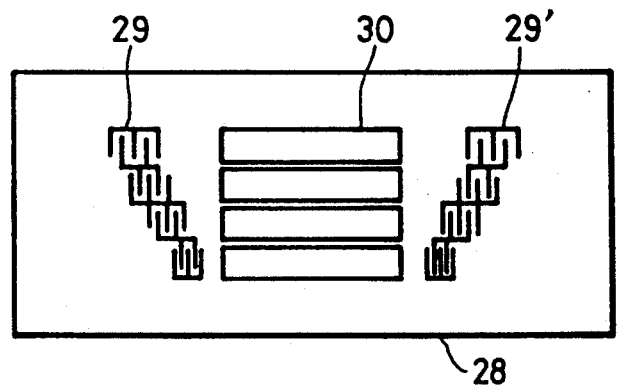
FIG. 11 is a plan view of an SAW convolver indicating still another embodiment.

FIG. 11 shows still another embodiment of the present invention, in which the output gate electrode 30 is divided into strip shapes in the propagation direction of the SAW so that the wave guide effect can be obtained in order to suppress crosstalk between different channels obtained by the division.

Figure 12:
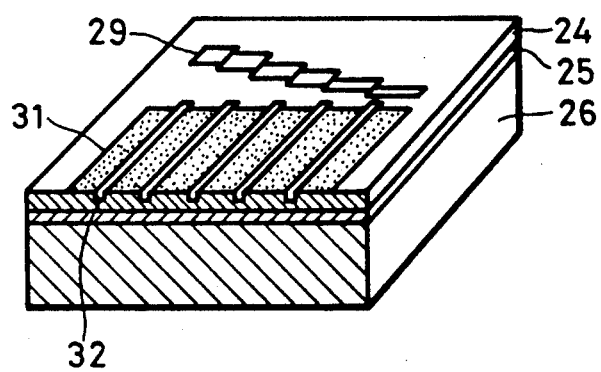
FIG. 12 is a perspective view of an SAW convolver showing still another embodiment.

FIG. 12 shows an embodiment, in which the suppression of the crosstalk is effected by grooves 32 formed by removing partially the surface portion of the piezoelectric substrate 24 in a shape of lines in the propagation direction of the SAW. 31 represents a strip shaped output gate electrode.

No ideal operation of convolvers can be realized only by compensating the velocity dispersion, which the substrate used for the convolver has, by varying the excitation position, corresponding to the frequency of the SAW. On the contrary, according to the present invention, the duration of the integration time for different frequency component is made uniform over the whole working frequency band and in this way it is possible to realize an ideal convolution operation.

Further each of the uniform pitch interdigital electrodes constituting the input transducers has an extremely simple structure and therefore the design thereof is easy. In addition, the positional relationship in the case where the interdigital electrodes are connected in parallel can be calculated in a simple manner by using a dispersion curve ($v(\omega_n)$) of the sound velocity of the SAW. Consequently, it is possible to realize an input transducer having a wide frequency band in a simple manner.

What is claimed is:

1. A surface acoustic wave device comprising:

a piezoelectric substrate, in which the sound velocity of the surface acoustic wave has a velocity dispersion;

a pair of input transducer means at left and right end portions on said substrate; and an output gate electrode formed on said substrate between said input transducer means;

wherein said input transducer means includes a plurality of pairs of input transducers juxtaposed in a direction perpendicular to a propagation direction of the surface acoustic wave; each of the pairs of input transducers having uniform pitch interdigital electrodes; the pitches of the electrodes of different pairs being different; and the distance between the transducers of different pairs being different from each other;

wherein said output gate electrode is divided, corresponding to propagation paths of the surface acoustic wave between different pairs of input transducers disposed at the left and right end portions on the substrate; and wherein grooves are formed under said divided output gate electrode, corresponding to parts of the electrode this obtained.

2. A surface acoustic wave device comprising:

a piezoelectric substrate, in which the sound velocity of the surface acoustic wave has a velocity dispersion represented by a function of the frequency;

a pair of input transducers at left and right end portions on said substrate; and an output gate electrode formed on said substrate between said input transducers;

wherein the distance between said pair of input transducers in a direction parallel to the propagation direction of the surface acoustic wave varies along said substrate in a direction perpendicular to said propagation direction; and wherein the length of said output gate electrode in the propagation direction of the surface acoustic wave varies along said substrate with respect to the direction perpendicular to said propagation direction, and dummy electrodes are disposed on both sides of said output gate electrode so that the combined shape of said output and dummy electrodes is a rectangle in appearance.

3. A surface acoustic wave device comprising:

a piezoelectric substrate, in which the sound velocity of the surface acoustic wave has a velocity dispersion represented by a function of the frequency;

a pair of input transducer means at left and right end portions on said substrate; and an output gate electrode formed on said substrate between said input transducer means;

wherein said input transducer means includes a plurality of pairs of juxtaposed input transducers; and wherein the length of said output gate electrode in a propagation direction of the surface acoustic wave varies along said substrate with respect to the direction perpendicular to said propagation direction, and dummy electrodes are disposed on both sides of said output gate electrode so that the combined shape of said output and dummy electrodes is a rectangle in appearance.

4. A surface acoustic wave device comprising:

a piezoelectric substrate, in which the sound velocity of a surface acoustic wave has a velocity dispersion;

a pair of input transducer means at left and right end portions of said substrate; and an output gate electrode formed on said substrate between said input transducer means;

wherein said input transducer means includes a plurality of pairs of input transducers juxtaposed in a direction perpendicular to a propagation direction of the surface acoustic wave, each of the pairs of input transducers including uniform pitch interdigital electrodes, the pitches of the electrodes of different said pairs of input transducers being different, and the distance between the input transducers of each said pair differing from the distance between the input transducers of other said pairs; and means for compensating for said velocity dispersion, including the relationship $l_n = \tau \cdot v(\omega_n)$ where $l_n$ is the distance between the input transducers of a respective said pair, n is a unique number for each said pair of transducers, $\tau$ is a desired delay time for the center angular frequency $\omega_o$ of the SAW device, $\omega_n$ is the angular frequency of each said pair, and $v(\omega_n)$ is the velocity of sound of a SAW corresponding to $l_n$.

5. A surface acoustic wave device according to claim 4, wherein said output gate electrode is divided into plural parts corresponding to the propagation paths of the surface acoustic wave between the input transducers of respective said pairs.

6. A surface acoustic wave device according to claim 5, wherein grooves are formed along a surface of said substrate, each said groove being between a respective adjacent pair of said parts of aid output gate electrode.

7. A surface acoustic wave device comprising:

a piezoelectric substrate, in which the sound velocity of a surface acoustic wave has a velocity dispersion which is a function of frequency;

a pair of input transducers at left and right end portions of said substrate, each said input transducer having a center line extending approximately perpendicular to a traveling direction of the surface acoustic wave, and having means responsive to an input signal with a frequency distribution for introducing a plurality of surface acoustic waves at respective frequencies into said piezoelectric substrate at respective locations spaced from each other along the input transducer in a direction approximately parallel to said center line thereof;

an output gate electrode formed on said substrate between said input transducers to take out from said device an output signal which is a function of respective input signals applied to said input transducers; and means for compensating for said velocity dispersion, including the distance l(y) between said center lines of said input transducers in a direction parallel to said traveling direction being defined by $$\frac{l(y)}{v(\omega(y))} = \tau$$

where y represents distance in a direction perpendicular to said traveling direction, v is the velocity of sound of a surface acoustic wave, $\omega(y)$ represents the center frequency distribution of the surface acoustic wave with respect to said direction perpendicular to said traveling direction, and $\tau$ is a delay time; and including the distance L(y) between end portions of said output gate electrode in a direction parallel to said traveling direction being defined by $$\frac{L(y)}{v(\omega(y))} = T$$

where T is an integration time.

8. The surface acoustic wave device according to claim 7, wherein the distance L(y) between end portions of said output gate electrode in the direction parallel to said traveling direction varies continuously with respect to the direction perpendicular to said traveling direction.

9. The surface acoustic wave device according to claim 7, wherein the distance L(y) between end portions of said output gate electrode in the direction parallel to said traveling direction varies stepwise with respect to the direction perpendicular to said traveling direction.

10. The surface acoustic wave device according to claim 7, wherein dummy electrodes are provided on said substrate adjacent opposite ends of said output gate electrode, each said dummy electrode having a configuration compensating for variations in the length L(y) of said output gate electrode so that the combined shape of said output gate electrode and said dummy electrodes is substantially a rectangle.

11. A surface acoustic wave device according to claim 7, wherein two of said surface acoustic waves introduced into said piezoelectric substrate at different said locations have respective frequencies which are nonharmonic.

12. A surface acoustic wave device comprising:
a piezoelectric substrate, in which the sound velocity of a surface acoustic wave has a velocity dispersion which is a function of frequency;
a pair of input transducer means at left and right end portions of said substrate, each said input transducer means being responsive to an input signal with a frequency distribution for introducing a plurality of surface acoustic waves at respective frequencies into said piezoelectric substrate at respective locations spaced from each other along the input transducer means in a direction approximately perpendicular to a traveling direction of the surface acoustic waves;
an output gate electrode formed on said substrate between said input transducer means to take out from said device an output signal which is a function of respective input signals applied to respective said input transducer means; and
means for compensating for said velocity dispersion, including said input transducer means having a plurality of pairs of juxtaposed input transducers; the distance $l_n$ between the input transducers of each said pair being defined by $$\frac{l_n}{v(\omega_n)} = \tau$$

where n is a unique number for each said pair, v is the velocity of sound of a surface acoustic wave, $\omega$ is a center frequency, and $\tau$ is a delay time; and including said output gate electrode having a length L in a direction parallel to the traveling direction which varies with respect to a direction perpendicular to said traveling direction, and the length L thereof between each said pair of input transducers being defined by $$\frac{L_n}{v(\omega_n)} = T$$

where T is an integration time.

13. The surface acoustic wave device according to claim 12 wherein said output gate electrode is divided into plural parts respectively corresponding to surface acoustic wave traveling paths between the input transducers of respective said pairs.

14. The surface acoustic wave device according to claim 12, wherein dummy electrodes are provided on said substrate adjacent opposite ends of said output gate electrode, each said dummy electrode having a configuration compensating for variation of the length $L_n$ of said output gate electrode so that the combined shape of said output gate electrode and said dummy electrodes is substantially a rectangle.

15. A surface acoustic wave device according to claim 12, wherein two of said surface acoustic waves introduced into said piezoelectric substrate at different said locations have respective frequencies which are nonharmonic.

16. A surface acoustic wave device comprising:
a piezoelectric substrate, in which the sound velocity of a surface acoustic wave has a velocity dispersion which is a function of frequency;
a pair of input transducers at left and right end portions of said substrate, each said input transducer having a center line extending approximately perpendicular to a traveling direction of the surface acoustic wave;
an output gate electrode formed on said substrate between said input transducers to take out from said device an output signal which is a function of respective input signals applied to said input transducers; and
means for compensating for said velocity dispersion, including the distance l(y) between said center lines of said input transducers in a direction parallel to said traveling direction being defined by $$\frac{l(y)}{v(\omega(y))} = \tau$$

whereby y represents distance in a direction perpendicular to said traveling direction, v is the velocity of sound of a surface acoustic wave, $\omega(y)$ represents the center frequency distribution of the surface acoustic wave with respect to said direction perpendicular to said traveling direction, and $\tau$ is a delay time; and including said output gate electrode being approximately trapezoidal and having a distance L(y) between end portions thereof in a direction parallel to said traveling direction being defined by $$\frac{L(y)}{v(\omega(y))} = T$$

where T is an integration time.

17. A surface acoustic wave device comprising:
a piezoelectric substrate, in which the sound velocity of a surface acoustic wave has a velocity dispersion which is a function of frequency;

a pair of input transducer means at left and right end portions of said substrate;

an output gate electrode formed on said substrate between said input transducer means to take out from said device an output signal which is a function of respective input signals applied to respective said input transducer means; and means for compensating for said velocity dispersion, including said input transducer means having a plurality of pairs of juxtaposed input transducers; the distance $l_n$ between the input transducers of each said pair being defined by $$\frac{l_n}{v(\omega_n)} = \tau$$

where n is a unique number for each said pair, v is the velocity of sound of a surface acoustic wave, $\omega$ is a center frequency, and $\tau$ is a delay time; and including said output gate electrode being approximately trapezoidal and having a length L in a direction parallel to the traveling direction which varies with respect to a direction perpendicular to said traveling direction, and the length L thereof between each said pair of input transducers being defined by $$\frac{L_n}{v(\omega_n)} = T$$

where T is an integration time.

* * * * *

UNITED STATES PATENT AND TRADEMARK OFFICE
CERTIFICATE OF CORRECTION

PATENT NO. : 5 189 330
DATED : February 23, 1993
INVENTOR(S) : Teruo NIITSUMA

It is certified that error appears in the above-identified patent and that said Letters Patent is hereby corrected as shown below:

```
Column 7, line 24; change "this" to ---thus---.
Column 8, line 32; change "aid" to ---said---.
```

Signed and Sealed this

Thirtieth Day of November, 1993

Attest:

BRUCE LEHMAN

*Attesting Officer*     *Commissioner of Patents and Trademarks*